United States Patent [19]

Holzhauer

[11] Patent Number: 4,479,115
[45] Date of Patent: Oct. 23, 1984

[54] FAN SPEED AND/OR FAN FAILURE DETECTOR

[75] Inventor: Norman H. Holzhauer, Aberdeen, N.J.

[73] Assignee: AT&T Bell Laboratories, Murray Hill, N.J.

[21] Appl. No.: 451,549

[22] Filed: Dec. 20, 1982

Related U.S. Application Data

[63] Continuation-in-part of Ser. No. 406,089, Aug. 6, 1982, abandoned.

[51] Int. Cl.³ .............................................. G08B 21/00
[52] U.S. Cl. .................................. 340/611; 340/626; 340/635; 340/530; 367/135; 381/56; 381/58; 415/118; 417/63
[58] Field of Search ............... 340/635, 611, 614, 626, 340/530; 417/63, 26, 12, 290; 415/30, 26, 118; 361/190; 307/120, 118; 318/481, 335; 367/13, 135; 381/56, 58

[56] References Cited

U.S. PATENT DOCUMENTS

| 2,969,530 | 1/1961 | Duncan | 381/56 |
| 4,000,450 | 12/1976 | Nurnberg | 318/481 |
| 4,345,247 | 8/1982 | Thornton et al. | 179/1 MN |

FOREIGN PATENT DOCUMENTS 115407  8/1979  Japan ................................. 415/118

Primary Examiner—James L. Rowland
Assistant Examiner—Daniel Myer
Attorney, Agent, or Firm—Ronald D. Slusky

[57] ABSTRACT

A pressure transducer, such as a microphone, is placed in proximity to the blades of a fan, such as a fan used to cool electronic equipment. As each blade passes the transducer, a pressure wave is generated that is converted into an electrical pulse by the transducer. Circuitry responsive to those pulses signals an alarm if the fan is not operating properly.

7 Claims, 1 Drawing Figure

FAN SPEED AND/OR FAN FAILURE DETECTOR

CROSS-REFERENCE TO RELATED APPLICATION

This application is a continuation-in-part of my copending application, Ser. No. 406,089, filed Aug. 6, 1982 now abandoned.

BACKGROUND OF THE INVENTION

The present invention relates to detection of fan speed and/or fan failure.

It is often desirable to provide a mechanism for automatically determining the speed of a fan, such as a fan used to cool electronic equipment, and/or to determine when the fan has failed, i.e., slowed down or stopped. One possible approach is to monitor the fan speed by sensing the rate at which an optical path is interrupted by the fan blades. Another approach is to monitor the fan speed by using a hall effect device to sense the rate at which the magnetic field created by the fan motor is rotating. Yet another approach, applicable principally only to fan failure, is to monitor the cooling airflow via a sail switch.

Each of these (and other) approaches has some disadvantage(s), however. For example, the sail switch needs to be delicately adjusted and, because it is a mechanical device, it is relatively unreliable. In addition, it will interfere with the airflow to some extent. A disadvantage of the optical approach is that the optical paths are subject to blockage. A disadvantage of the hall effect approach is that the hall effect device must be installed when the fan is manufactured. Thus such an arrangement is not readily retrofitted into existing installations. Moreover, stray magnetic fields may affect its operation.

SUMMARY OF THE INVENTION

The present invention is directed to a fan speed and/or fan failure detection arrangement which overcomes many of the drawbacks of prior art arrangements. It is, for example, reliable, requires virtually no maintenance, and can be easily retrofitted into existing installations employing ordinary cooling fans.

In accordance with the invention, a pressure transducer, such as a microphone, is placed in such proximity to the fan that the pressure waves generated by the fan impinge on the transducer. The pressure waves are converted into electrical pulses by the transducer and circuitry responsive to those pulses provides an indication which is a function of the pulse repetition rate and thus of the fan speed (since the former is a function of the latter). The indication may be, for example, an electrical signal, visual alarm, aural alarm, or other signal indicating whether the pulse repetition rate—or fan speed—is greater or less than some threshold. Alternatively, the indication might be a signal quantitatively indicating or related to the pulse repetition rate or fan speed. Such an indication might be used, for example, to drive circuitry which displays the fan speed and/or as an input to a fan speed control circuit.

BRIEF DESCRIPTION OF THE DRAWING

The sole FIGURE.

DETAILED DESCRIPTION

Figure 1:
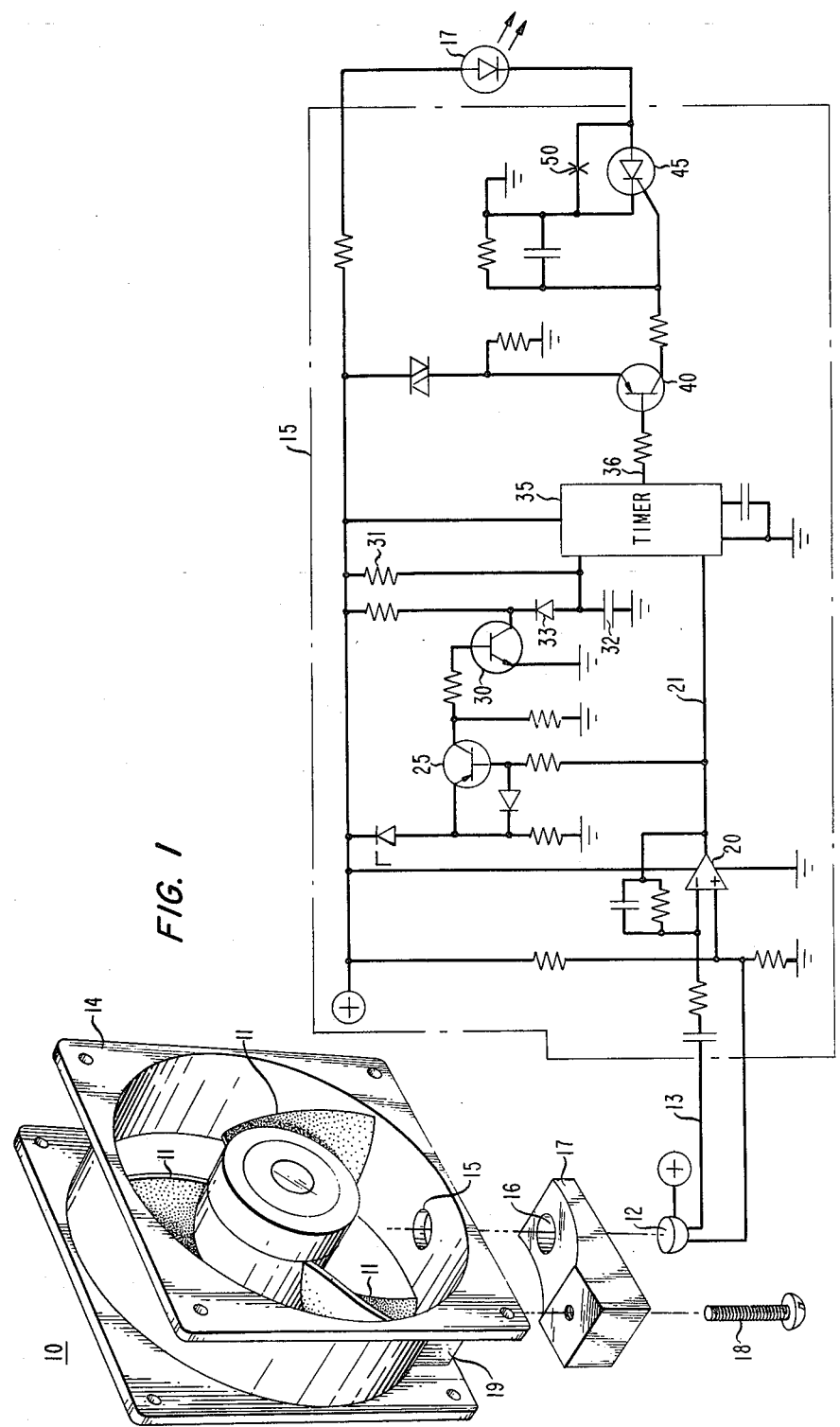
FIG. 1, depicts a fan failure detector embodying the principles of the invention.

The figure shows a fan 10 whose speed is to be monitored. In accordance with the invention, a transducer 12 is disposed in such proximity to blades 11 of fan 10 that the pressure waves generated by the blades when the fan is operating impinge on the transducer. The transducer, in turn, converts each pressure wave into an electrical pulse, or signal. The resulting stream of pulses is applied to a sensing circuit 15 which provides an indication which is a function of the repetition rate of the pulses. In this embodiment, in particular, circuit 15 activates a visual alarm—illustratively, a light-emitting diode (LED) 17—when the pulse rate, which is proportional to the fan speed, falls below a predetermined value.

Transducer 12 is illustratively an electret condenser audio microphone such as the EM60 microphone manufactured by Primo Microphone, Inc., Elk Grove Village, Illinois. It is secured within a hole 16 of a bracket 17. The latter is mounted on the housing of fan 10—illustratively via screw 18 which passes through the bracket and into mounting block 19—in such a way that transducer 12 is aligned with hole 15 in the fan housing, thereby putting the transducer in close proximity to blades 11. Alternatively, the transducer could, for example, be disposed just in front of blades 11 via a bracket attached to face 14 of the fan housing.

Within sensing circuit 15, the electrical output pulses received from the transducer on lead 13 are amplified and filtered to reduce high frequency noise and improve the pulse shape by an amplifier comprised of operational amplifier 20 and associated circuitry, thereby providing negative pulses on lead 21. Whenever a pulse appears on lead 21, the resulting signal extended to transistor 25 through its base resistor turns that transistor on. This, in turn, turns on transistor 30. Being thus made cconductive, transistor 30 discharges a timing capacitor 32 via diode 33. The negative pulse on lead 21 also causes lead 36 of timer 35 to go high, keeping transistor 40 in the 'off' state.

When the pulse on lead 21 terminates, transistors 25 and 30 turn off and capacitor 32 begins to charge, the charging current being supplied through resistor 31. Under these conditions, the voltage on lead 36 of timer 35 which may be, for example, a 555-type timer available from a number of manufacturers, remains high, thereby keeping transistor 40 off. If the voltage across capacitor 32 reaches a predetermined threshold, lead 36 on timer 35 goes low.

If the fan is rotating at at least its minimum acceptable speed, the threshold is never exceeded. This is ensured by selecting the RC time constant associated with capacitor 32 to be sufficiently large that each successive pulse on lead 21 causes the capacitor to be discharged before the voltage thereacross reaches the above-mentioned threshold. The time constant is chosen to be sufficiently small, on the other hand, that if the rotation of the fan falls below the minimum acceptable speed, the threshold is exceeded before the next-occurring pulse on lead 21 discharges the capacitor and resets the timer. The result in that case is that timer 35 provides a negative pulse on lead 36. This pulse turns on transistor 40 which, in turn, triggers SCR 45. The latter is thus latched in a conductive state, causing LED 17 to turn on and thus signal a fan slowdown or failure. The LED can thereafter be turned off by manually closing switch 50, which returns SCR 45 to a non-conductive state—assuming that the fan is once more running at normal speed.

Circuit 15 can be adapted for use with any fan speed and number of blades by adjusting the value of, for example, capacitor 32 or resistor 31 to change the time constant.

The foregoing merely illustrates the principles of the invention. Those skilled in the art will be able to devise numerous other arrangements which, although not explicitly disclosed herein, embody those principles. For example, circuit 15 could be further arranged in straightforward fashion to signal an alarm condition if the fan speed exceeds a predetermined upper threshold. Circuit 15 could also be arranged to measure the repetition rate of the pulses on lead 21 and to compute therefrom and display the actual fan speed. Another possibility is for circuit 15 to generate a quantitative indication of the pulse repetition rate or fan speed and provide same as an input to a fan speed control circuit.

What is claimed is:

1. Apparatus for use in conjunction with a fan, said apparatus comprising,
   transducer means for generating a stream of pulses in response to pressure waves impinging thereon,
   means adapted for mounting said transducer means in such proximity to said fan that the pressure waves generated by said fan when it is operating impinge on said transducer means, and
   means for generating a signal indicative of the time interval between successive pairs of said pulses and for providing an indication when said signal reaches a predetermined threshold.

2. Apparatus for use in conjunction with a fan, said apparatus comprising,
   transducer means for generating individual signals in response to respective pressure waves impinging on said transducer means,
   means adapted for mounting said transducer means on said fan in such proximity thereto that the pressure waves generated when said fan is operating impinge on said transducer means, and
   means for generating a signal indicative of the time interval between successive ones of said individual signals and for providing an indication when said indicative signal reaches a predetermined threshold.

3. Apparatus comprising
   a fan,
   transducer means for generating a stream of pulses in response to pressure waves generated by said fan, and
   means for generating a signal indicative of the time interval between successive pairs of said pulses and for providing an indication when said signal reaches a predetermined threshold.

4. Apparatus comprising
   a fan having at least one blade, each blade generating pressure waves when said fan is rotating,
   transducer means for converting said pressure waves into respective signals, and
   means for generating a signal indicative of the time interval between successive pairs of said respective signals and for providing an indication when said indicative signal reaches a predetermined threshold.

5. Apparatus comprising
   a fan having one or more blades,
   transducer means for generating electrical pulses in response to pressure waves impinging thereon,
   means for mounting said transducer means in such proximity to said one or more blades that the pressure waves generated by said one or more blades when said fan is rotating impinge on said transducer means, and
   means for generating a signal indicative of the time interval between successive pairs of said pulses and for providing an indication when said signal reaches a predetermined threshold.

6. The invention of claims 1, 2, 3, 4 or 5 wherein said transducer means is an audio microphone.

7. A method comprising the steps of
   generating electrical signals in response to respective pressure waves produced by a fan,
   generating a signal indicative of the time interval between successive pairs of said electrical signals, and
   providing an indication when said indicative signal reaches a predetermined threshold.

* * * * *